United States Patent [19]
Watarai

[11] Patent Number: 5,644,252
[45] Date of Patent: Jul. 1, 1997

[54] DRIVER FOR INTERFACING INTEGRATED CIRCUITS TO TRANSMISSION LINES

[75] Inventor: Seiichi Watarai, Tokyo, Japan

[73] Assignee: NEC Corporation, Tokyo, Japan

[21] Appl. No.: 613,409

[22] Filed: Mar. 11, 1996

[30] Foreign Application Priority Data

Mar. 9, 1995 [JP] Japan .................... 7-049643

[51] Int. Cl.$^6$ .................................... H03K 17/16
[52] U.S. Cl. ........................ 326/27; 326/30; 326/86
[58] Field of Search .................... 326/26–27, 29–30, 326/34, 62, 83, 86

[56] References Cited

U.S. PATENT DOCUMENTS

| | | | |
|---|---|---|---|
| 5,023,488 | 6/1991 | Gunning | 307/475 |
| 5,111,080 | 5/1992 | Misukami et al. | 326/86 X |
| 5,134,311 | 7/1992 | Biber et al. | 326/30 X |
| 5,162,672 | 11/1992 | McMahan et al. | 326/86 |
| 5,285,116 | 2/1994 | Thaik | 326/95 X |
| 5,483,177 | 1/1996 | Van Lieverioo | 326/27 |
| 5,539,336 | 7/1996 | Nguyen et al. | 326/27 X |
| 5,572,146 | 11/1996 | Ahn et al. | 326/27 |

FOREIGN PATENT DOCUMENTS 0 599 631   11/1993   European Pat. Off. .

OTHER PUBLICATIONS

"High Speed CMOS Off–Chip Driver Designs for Improved Performance", IBM Technical Dislcosure Bulletin, vol. 31, No. 5, Oct. 1988, pp. 331–332.

*Primary Examiner*—David R. Hudspeth
*Attorney, Agent, or Firm*—Foley & Lardner

[57] ABSTRACT

In order to effectively interface a plurality of integrated circuits to a bus, an improved driver is disclosed. The driver includes an inverter provided between a power source and a ground level, and an output transistor whose gate is coupled to an output of the inverter and whose source-drain path is coupled between an output of the driver and the second power source. A feedback path is coupled between the output of the driver and the output of the inverter. The feedback path includes first and second transistors coupled in series. The first transistor has its gate coupled to an input of the inverter, while the second transistor has its gate coupled to the output of the inverter via delay means. The driver is characterized by an impedance controller which is provided between the output of the inverter and the second power source. The impedance controller stepwisely adjusts impedance of the output transistor when an input signal to the inverter changes from a low logic level to a high logic level. As an alternative to or in combination of the impedance controller, another impedance controller is provided which is provided in parallel with the second transistor and which stepwisely adjusts the impedance of the output transistor when the input signal to the inverter changes from the low logic level to the high logic level.

9 Claims, 7 Drawing Sheets

DRIVER FOR INTERFACING INTEGRATED CIRCUITS TO TRANSMISSION LINES

BACKGROUND OF THE INVENTION

1. Field of the Invention

The present invention relates generally to a driver for interfacing integrated circuits (ICs) to transmission lines, and more specifically to such a driver which is able to effectively reduce switching transients induced in a transmitting signal due to parasitic components.

2. Description of the Related

A digital system such as a computer and the like includes a plurality of IC devices which are interconnected for binary communications by transmission lines. Each IC device is provided with a driver and/or receiver for interfacing ICs of the device to the transmission lines.

Figure 1:
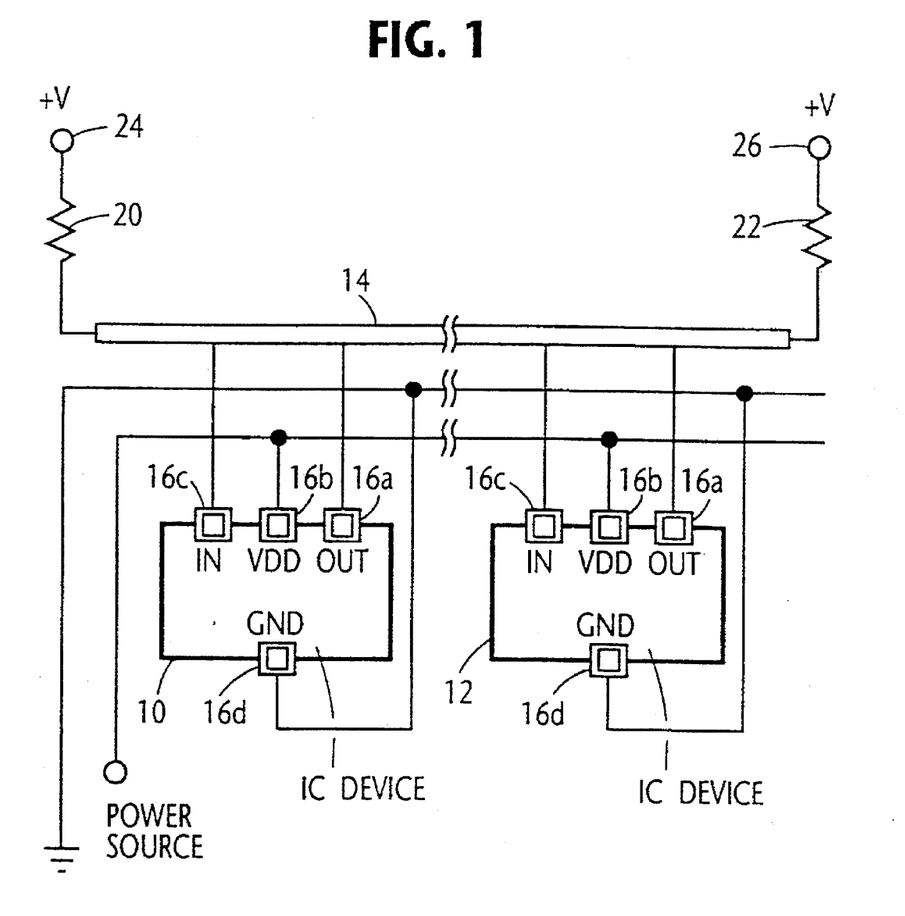
FIG. 1 is a block diagram schematically showing a plurality of IC devices coupled to a bus for exchanging data therebetween, having been referred to in the opening paragraphs.
Figure 2:
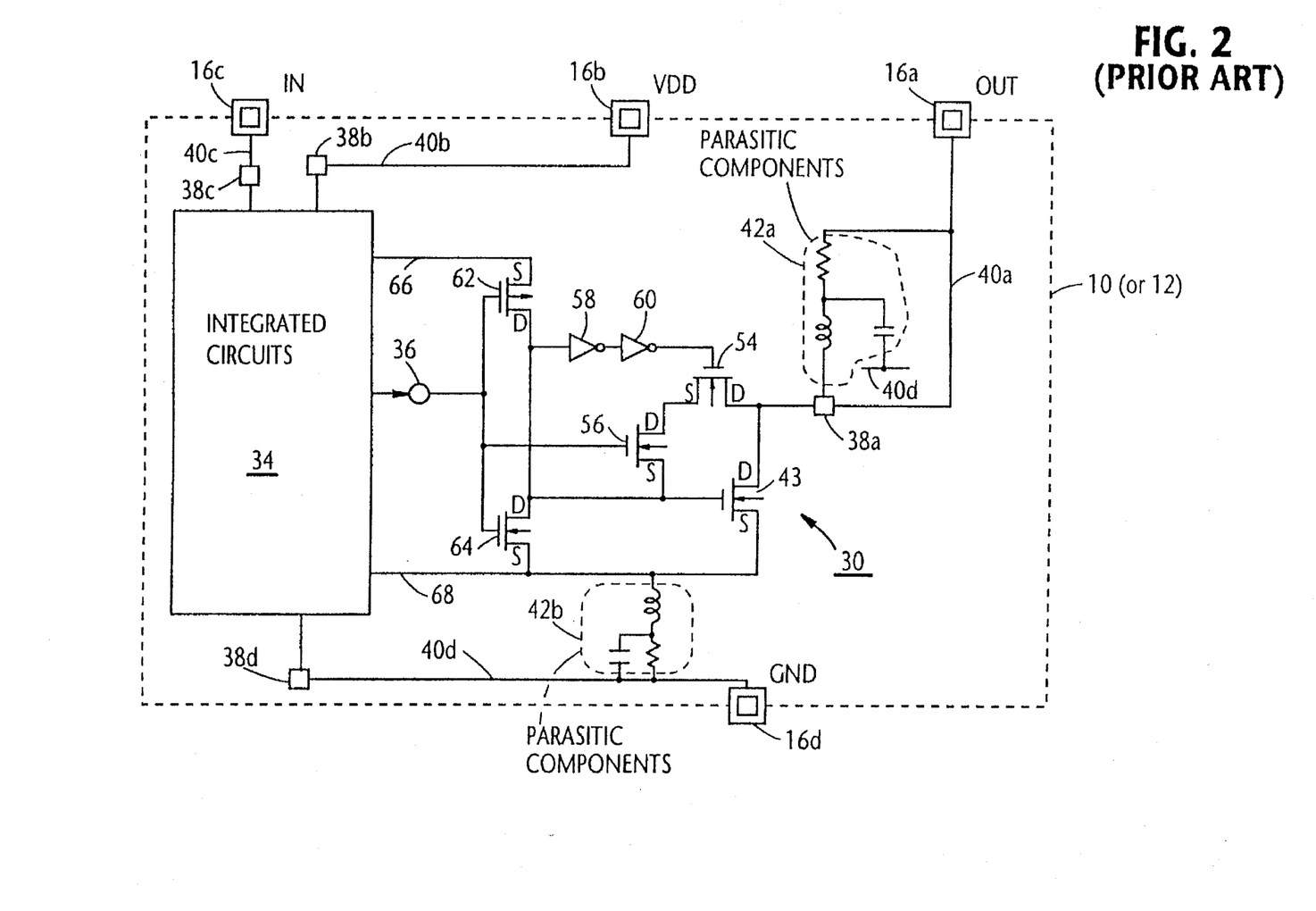
FIG. 2 is a block diagram showing a conventional driver encased in one of the IC devices of FIG. 1.

Before turning to the present invention it is deemed preferable to discuss a conventional driver with reference to FIGS. 1 and 2. In the drawings attached to the specification, like elements or portions are denoted by like reference numerals.

FIG. 1 is a block diagram schematically showing IC devices 10 and 12 which are coupled via the package terminals thereof to a bus 14. Although not shown in FIG. 1, the bus 14 is comprised of a plurality of transmission lines as is well known in the art. For the sake of simplifying the disclosure, each of the IC devices 10 and 12 has only four terminals 16a–16d which are relevant to the present invention.

As shown in FIG. 1, the terminals 16a–16d of the IC device 10 or 12 are respectively assigned to a data output terminal (OUT), power source terminal (VDD), data input terminal (IN), and ground terminal (GND).

The bus 14 usually is microstrip lines formed on a suitable substrate such as a PCB (printed circuit board)(not shown). Similarly, the lines extending from the package terminals 16a–16d are typically formed on a substrate on which the IC devices 10 and 12 are mounted.

As is known in the art, with a bus of substantial length, it is common to "terminate" data transmission lines at their opposite ends with a resistive pullup or pulldown. That is, each transmission line of the bus 14, which has relatively low characteristic impedance on the order of about 50Ω–70Ω, has opposite ends coupled to resistors 20 and 22 for terminating in the line's characteristic impedance. The bus terminating resistors 20 and 22 are respectively connected, via terminals 24 and 26, to source voltage (+V) on the order of about 1.2 V–2.0 V (for example).

FIG. 2 is a block diagram schematically showing an arrangement inside the IC device 10 (or 12), which includes a driver 30 to which the present invention is applied. The driver 30 is disclosed in U.S. Pat. No. 5,023,488 to William F. Gunning.

The IC device 10 includes, in addition to the aforesaid driver 30, a plurality of integrated circuits which are collectively depicted by block 34. The driver 30 receives binary information from the block 34 via an input terminal 36 and interfaces the block 34 to the bus 14 (FIG. 1). The driver 30 and the IC block 34 are formed on the same IC chip. Rectangular notations 38a–38d indicate "contact pads" formed on the IC chip, which pads are electrically coupled to the corresponding package terminals 16a–16d via respective bonding wires 40a–40d of aluminum or gold. More specifically, the IC chip pad 38a is the output terminal of the driver 30. Electrical elements enclosed by broken lines 42a and 42b indicate parasitic components which from noticeable ringing circuits especially when an N-channel CMOS transistor 43 of the driver 30 is switched from a conductive state to a non-conductive state. These ringing circuits are liable to cause the voltage on the transmission line 14 (FIG. 1) to oscillate around the terminating voltage +V (FIG. 1) for a prolonged period time.

In the drawings attached to the instant specification, capital letters "D" and "S" respectively indicate "drain" and "source" terminals of CMOS transistors.

In order to reduce the switching transients resulting from the parasitic components 42a–42b, the driver 30 is provided with a feedback path and a delay circuit. The feedback path includes two N-channel CMOS transistors 54 and 56, while the delay circuit includes two inverters 58 and 60.

In addition, the driver 30 includes another inverter which includes a P-channel CMOS transistor 62 and an N-channel CMOS transistor 64. Reference numerals 66 and 68 depict respectively a power line and a ground line both formed on the IC chip including the driver 30 and the block 34.

The operation of the driver 30 of FIG. 2 is described.

A low logic level signal at the input terminal 36 holds the P-channel CMOS transistor 62 in a conductive state and the N-channel CMOS transistors 64 and 56 in a non-conductive state. Thus, the N-channel CMOS transistor 54 is in a conductive state. This means that the feedback path (54, 56) is not established while the low logic level appears at the input terminal 36.

However, shortly after the logic level of the signal at the input terminal 36 is raised to a logic high level, the transistors 62 and 64 are respectively rendered non-conductive and conductive. Thus, the transistor 64 tends to pull the gate of the N-channel transistor 43 down toward ground. At the same time, the transistor 56 is switched into conduction so that it establishes a feedback path between the drain and the gate of the transistor 43. Thus, the feedback path prevents the drain voltage of the transistor 43 (viz., the voltage at the output terminal 38a) from increasing to a level significantly above its gate voltage. This limits the rate at which the current flowing through the parasitic components 42a and 42b (especially 42a). It follows that the undesirable oscillation (viz., switching transients) of the transmitting signal appearing at the bus 14 is reduced. Finally, about one or few nanoseconds after the transistor 56 is rendered conductive, the output of the inverter 60 drops to the low logic level. Therefore, the transistor 54 is switched into a non-conductive state so that the feedback path is re-opened thereby permitting the transistor 43 to switch completely out of conduction.

The amplitude of the signal being transmitted over the bus 14 is determined by: (a) parallel resistance of the bus line's characteristic impedance and the resistance of the terminating resistors 20 and 22, (b) the terminating voltage +V, and (c) a divided voltage (at the output terminal 38a) defined by the resistance of the open drain CMOS transistor 43. When the bus terminating voltage +V is 1.2 V, the logic voltage swing becomes about 0.8 V. Since the high logic level is 1.2 V in this case, the low logic level becomes 0.4 V (=1.2 V−0.8 V).

It is assumed that the IC device 10 outputs a logic signal which is transmitted to the IC device 12 over the bus 14. The IC device 12 includes a receiver (not shown) which discriminates whether the logic level received is high ("1") or low ("0") using an input threshold. The input threshold is usually set to an intermediate point of the above mentioned logic voltage swing. That is, the intermediate point is set to 0.8 V (=(1.2 V−0.8 V)+0.4 V) in the above case. At a time point after the receiver acquires the logic signal, the receiver determines whether the logic signal received is high or low. This is done by defining, at the logic level determining time point, if the logic signal level is above or below the input threshold. This means that the aforesaid oscillation (viz., ranging) of the output signal of the driver 30 should be damped as early as possible.

Figure 3:
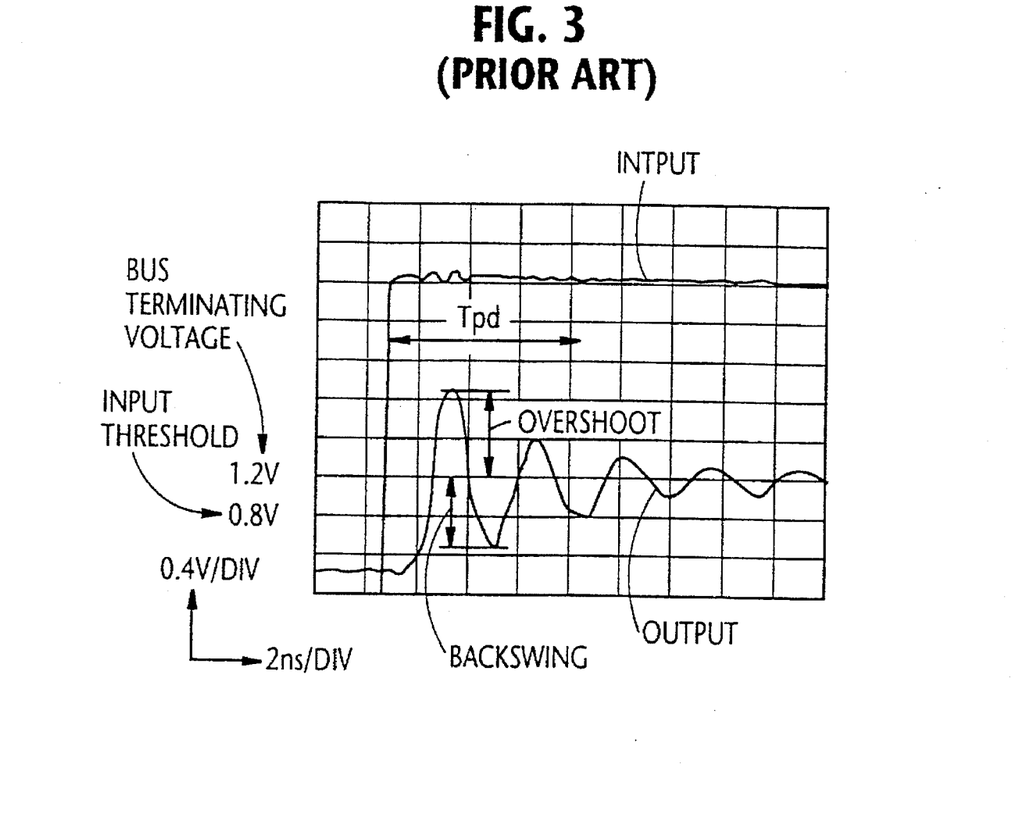
FIG. 3 is a diagram showing a result of computer simulation of switching transients when the driver of FIG. 2 receives a logic signal changing from a low level to a high level.

The inventor conducted computer simulation to study how the output of the driver 30 oscillates when a high logic level is applied to the input terminal 36. The result of the simulation is shown in FIG. 3 wherein a legend "INPUT" indicates the signal applied to the input terminal 36 while "OUTPUT" indicates the output of the driver 30 (viz., the logic signal appearing at the bus 14). As shown, the output significantly swings upward and downward shortly after the input is applied to the terminal 36, resulting in relatively large "overshoot" and "backswing". More specifically, the output of the driver 30 crosses several times the input threshold (0.8 V) and thus, the receiver (not shown) of the IC device (12 for example) is unable to ascertain the logic level until the output of the driver 30 stops the crossing of the input threshold. In other words, with the driver 30 of FIG. 2, a propagation delay Tpd is noticeably large.

Figure 4:
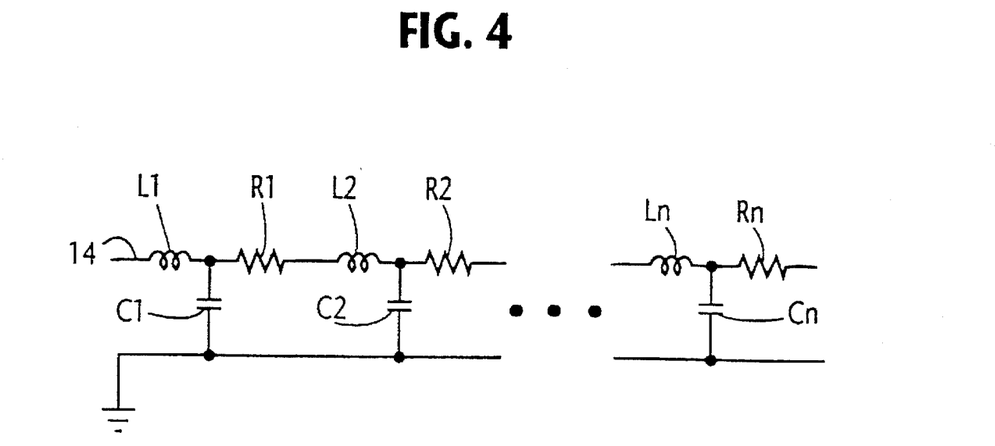
FIG. 4 is a diagram showing bus-side parasitic elements, having been described in the opening paragraphs.

We have thus far discussed the parasitic components related to the IC package. However, as shown in FIG. 4, when the low logic level jumps to the high level, a plurality of inductive and resistive parasitic components L1, L2, ... , Ln and R1, R2, ... , Rn are developed in series with the bus line 14, while capacitive parasitic components C1, C2, ... , Cn are induced between the bus line 14 and the ground line formed on the PCB which carries the IC devices 10 and 12. These bus-side parasitic elements tends to enhance the above mentioned undesirable oscillation.

SUMMARY OF THE INVENTION

It is therefore an object of the present invention to provide an improved driver which attains effective reduction of the oscillation in the output of the driver when the driver is supplied with a logic input which increases from the low level to the high level.

These objects are fulfilled by a technique wherein in order to effectively interface a plurality of integrated circuits to a bus, improvements are made to the conventional driver. The driver includes an inverter provided between a power source and a ground level, and further includes an output transistor whose gate is coupled to an output of the inverter and whose source-drain path is coupled between an output of the driver and the second power source. A feedback path is coupled between the output of the driver and the output of the inverter. The feedback path includes first and second transistors coupled in series. The first transistor has its gate coupled to an input of the inverter, while the second transistor has its gate coupled to the output of the inverter via delay means. The driver is characterized by an impedance controller which is provided between the output of the inverter and the second power source. The impedance controller stepwisely adjusts impedance of the output transistor when an input signal to the inverter changes from a low logic level to a high logic level. As an alternative to or in combination of the impedance controller, another impedance controller is provided which is provided in parallel with the second transistor and which stepwisely adjusts the impedance of the output transistor when the input signal to the inverter changes from the low logic level to the high logic level.

More specifically, a first aspect of the present invention resides in a driver for interfacing a plurality of integrated circuits to a bus, the driver comprising: an inverter provided between first and second power sources; an output transistor whose gate is coupled to an output of the inverter and whose source-drain path is coupled between an output of the driver and the second power source; a feedback path coupled between the output of the driver and the output of the inverter, the feedback path including first and second transistors coupled in series, the first transistor having a gate thereof coupled to an input of the inverter, the second transistor having a gate thereof coupled to the output of the inverter via delay means; characterized in that an impedance controller is provided between the output of the inverter and the second power source, the impedance controller stepwisely adjusting impedance of the output transistor when an input signal to the inverter changes from a low logic level to a high logic level.

A second aspect of the present invention resides in a driver for interfacing a plurality of integrated circuits to a bus, the driver comprising: an inverter provided between first and second power sources; an output transistor whose gate is coupled to an output of the inverter and whose source-drain path is coupled between an output of the driver and the second power source; a feedback path coupled between the output of the driver and the output of the inverter, the feedback path including first and second transistors coupled in series, the first transistor having a gate thereof coupled to an input of the inverter, the second transistor having a gate thereof coupled to the output of the inverter via delay means; characterized in that an impedance controller is provided in parallel with the second transistor, the impedance controller adjusting stepwisely impedance of the output transistor when an input signal to the inverter changes from a low logic level to a high logic level.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first preferred embodiment of the present invention is discussed with reference to FIGS. 5 and 6.

A driver (depicted by numeral 69 in FIG. 5) according to the first embodiment differs from the driver 30 of FIG. 2 in that the driver 69 includes six inverters 70a–70f and further includes two N-channel CMOS transistors 72 and 74. Other than this, the driver 69 is substantially identical with the driver 30 of FIG. 2.

Figure 5:
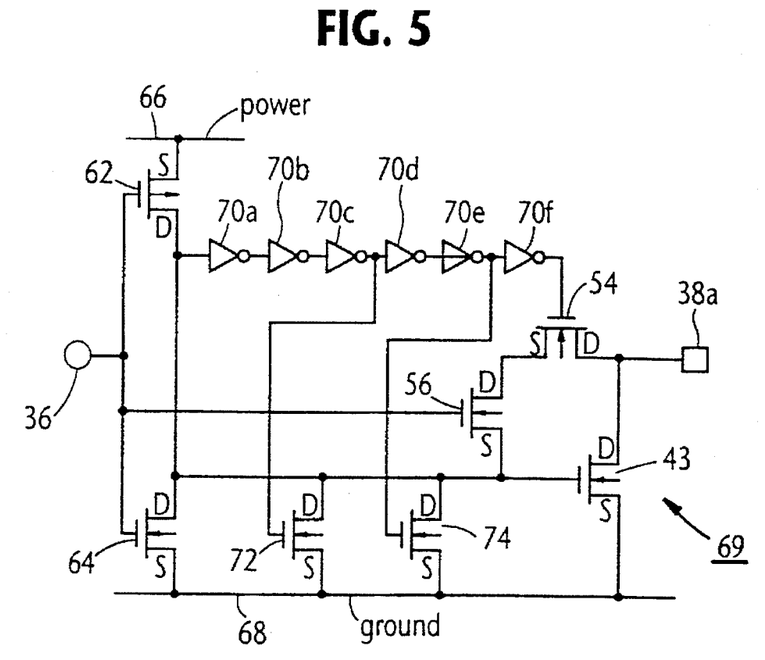
FIG. 5 is a block diagram showing a first embodiment of the present invention.

As shown in FIG. 5, the inverters 70a–70f are coupled in series between the output of the inverter consisting of the transistors 62 and 64 and the gate of the transistor 54. The transistor 72 has its gate coupled to the output of the inverter 70c, and its drain-source path coupled between the source of the transistor 56 and the IC chip's ground line 68. Similarly, the transistor 72 has its gate coupled to the output of the inverter 70e, and its drain-source path coupled between the source of the transistor 56 and the IC chip's ground line 68. The transistors 72 and 74 operate as an impedance controller of the driver 69.

The operations of the elements shown in FIG. 5 and identical to those shown in FIG. 2, may be omitted except that they are necessary to discuss the present invention.

As mentioned above with reference to FIG. 2, a low logic level signal at the input terminal 36 holds the transistor 62 in a conductive state and the transistors 64 and 56 in a non-conductive state. Thus, the N-channel CMOS transistor 54 is in a conductive state as in the case of FIG. 2 and hence, the feedback path (54, 56) is not established while the low logic level appears at the input terminal 36. In the above case, the transistors 72 and 74 are not conductive.

Shortly after the logic level of the signal at the input terminal 36 is raised to a logic high level, the transistors 62 and 64 are respectively rendered non-conductive and conductive. Thus, the transistor 64 tends to pull the gate of the N-channel transistor 43 down toward ground as mentioned with the conventional driver. At the same time, the transistor 56 is switched into conduction so that it establishes a feedback path between the drain and the gate of the transistor 43.

Shortly after the transistor 56 is rendered conductive, the output of the inverter (62 and 64) 60 drops to the low logic level. The low level output of the inverter (62 and 64) successively changes the outputs of the inverters 70a–70f in this order from the high level to the low level and vice versa. Therefore, when the output of the inverter 70c changes to the high level, the transistor 72 is rendered conductive and accordingly, the current derived from the feedback path (54 and flows through the transistor 72 in addition to the transistor 64. Following this, when the output of the inverter 70e changes to the high level, the transistor 74 is switched into conduction. Therefore, the current derived from the feedback path (54 and 56) flows through the transistor 74 in addition to the transistors 64 and 72.

Finally, the last inverter 70f is switched out of conduction, the feedback path is re-opened thereby permitting the output transistor 43 to switch completely out of conduction. This operation is identical with the conventional driver 30 of FIG. 2.

As mentioned above, after the feedback path is closed in response to the high logic level at the input terminal 36, the transistors 72 and 74 are successively rendered conductive in order to form an additional current path(s). In other words, the impedance of the drain-source of the output transistor 43 is stepwisely controlled until the transistor 43 is completely switched out of conduction.

In order to effectively suppress the switching transients, the potential applied to the gate of the output transistor 43, which changes in three steps, must be adjusted. This justification is implemented by adjusting the gate width and/or the gate length of each of the transistors 54, 56, 64, 72 and 74. Further, the time interval between the potential changes at the gate of the transistor 43 must be adjusted. This is carried out by adjusting the gate length and/or the gate channel of the transistors of the inverters 70a–70f. As an alternative, the above mentioned time interval can be changed by changing the number of inverters (70a–70f).

It is clear that the number of the inverters is in no way limited to the six as in the first embodiment. Similarly, the number of the transistors (72 and 74) is not limited to the number shown in the first embodiment.

Figure 6:
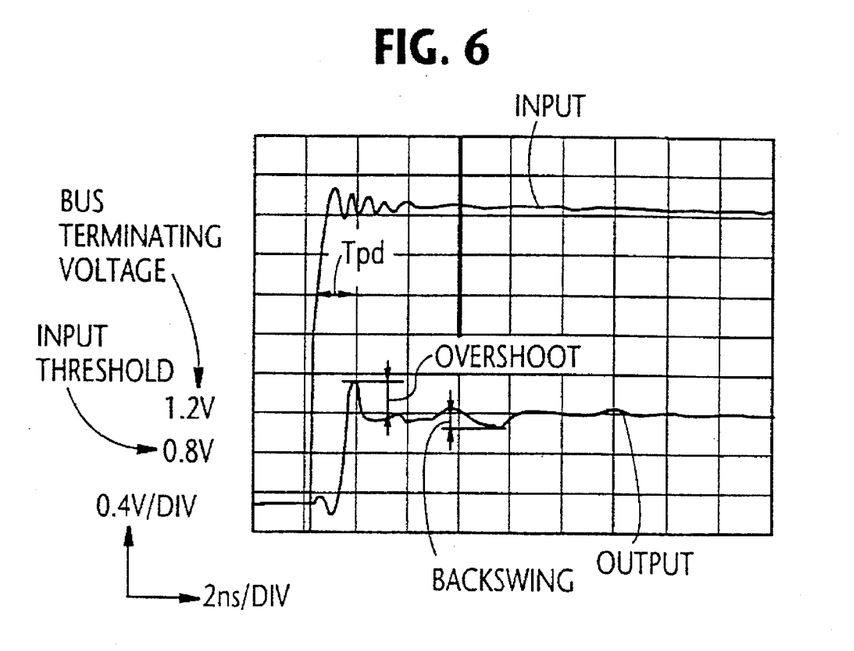
FIG. 6 is a diagram showing a result of computer simulation of switching transients when the driver of FIG. 5 receives a logic signal changing from a low level to a high level.

FIG. 6 is a diagram showing a result of computer simulation conducted by the inventor in order to demonstrate the switching transients in the output signal from the driver 69. It is readily understood that the "overshoot" and "backswing" are markedly reduced compared with the conventional counterpart. More specifically, the output of the driver 69 does not cross the input threshold (0.8 V) and thus, the propagation delay Tpd can be shortened to an extensive degree. This means that the operation rate of the IC device can extensively be increased.

Figure 7:
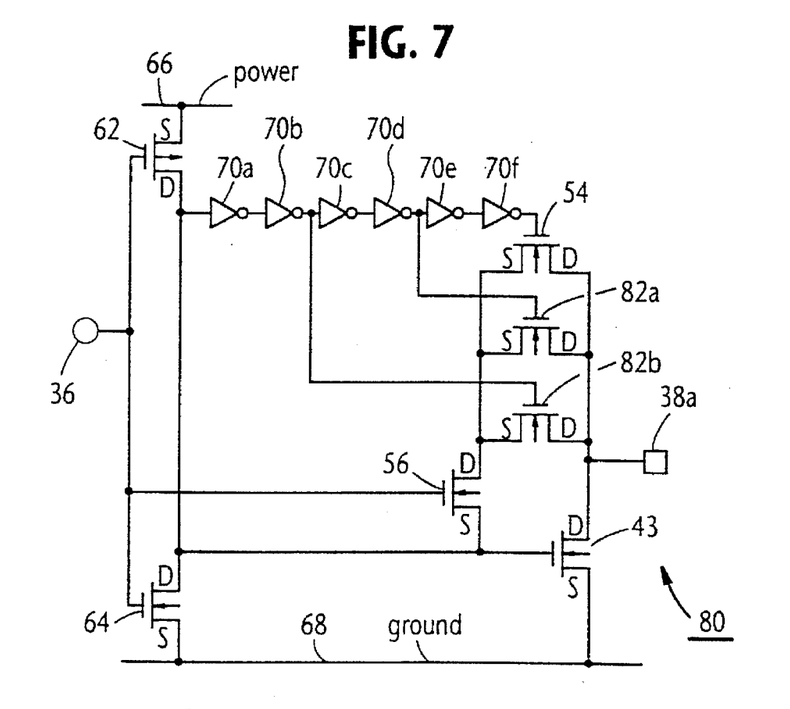
FIG. 7 is a block diagram showing a second embodiment of the present invention.

A second embodiment of the present invention is discussed with reference to FIGS. 7 and 8.

A driver 80 according to the second embodiment includes two N-channel CMOS transistors 82a and 82b in place of the transistors 72 and 74 of FIG. 5. As shown, the transistors 82a and 82b are respectively coupled in parallel with the transistor 54. Other than this, the second embodiment is identical with the first one and thus, further description of the second embodiment is omitted for brevity.

Figure 8:
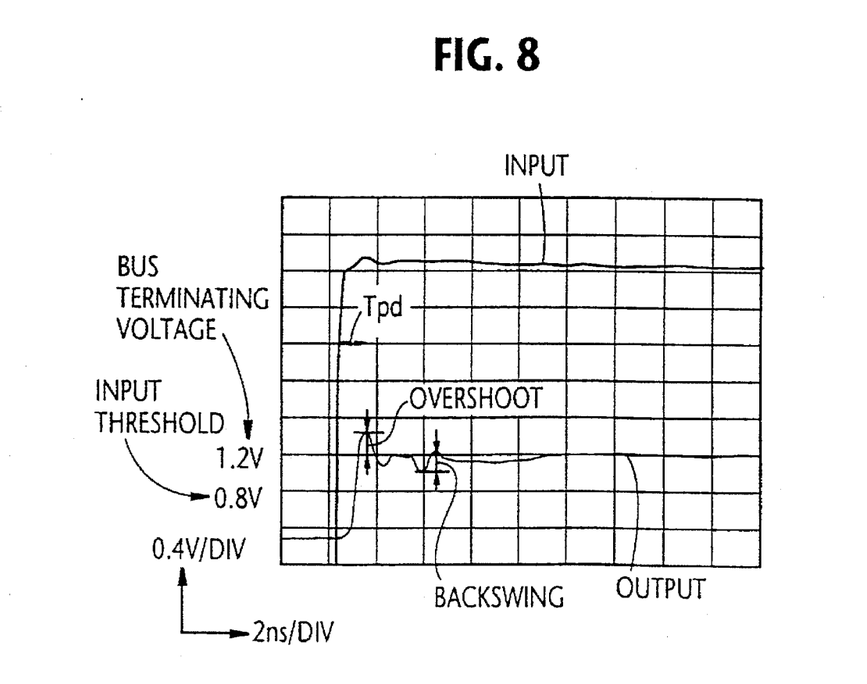
FIG. 8 is a diagram showing a result of computer simulation of switching transients when the driver of FIG. 7 receives a logic signal changing from a low level to a high level.

FIG. 8 is a diagram showing a result of computer simulation conducted by the inventor in order to demonstrate the switching transients in the output signal from the driver 80. It is understood that the "overshoot" and "backswing" are extensively reduced compared with the conventional counterpart.

Figure 9:
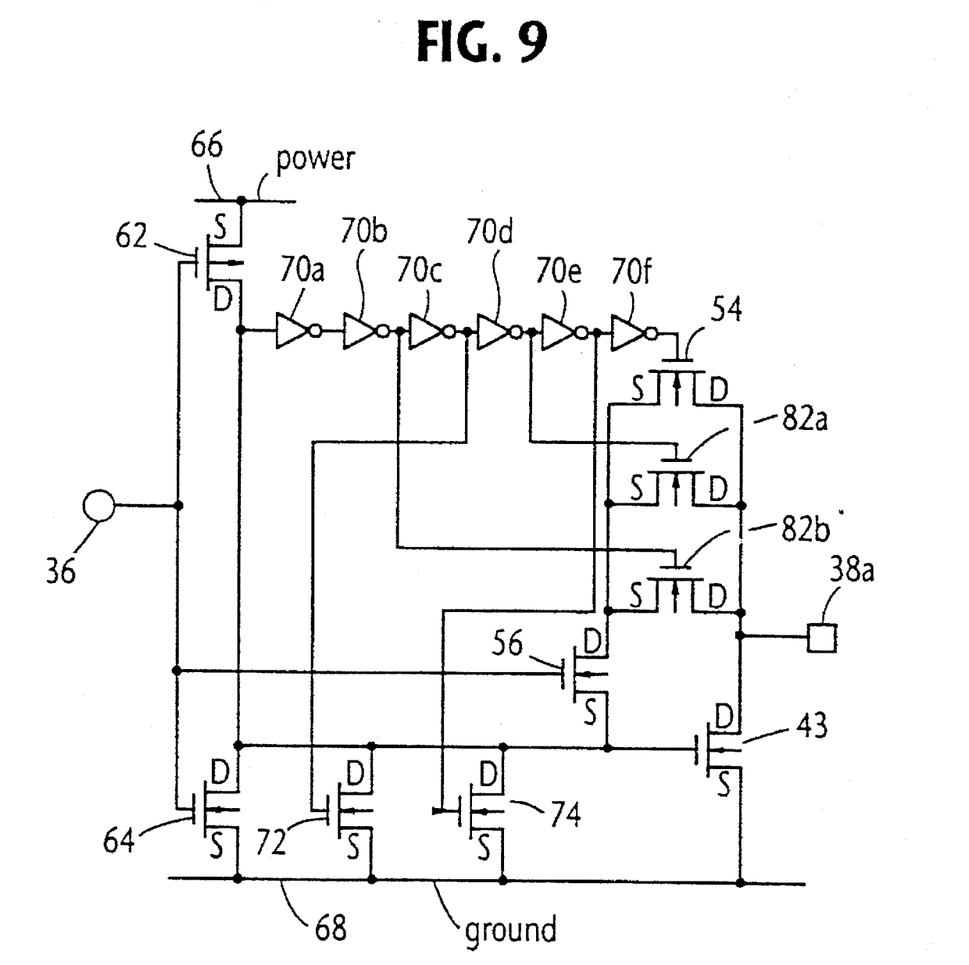
FIG. 9 is a block diagram showing a third embodiment of the present invention.

FIG. 9 is a block diagram showing a third embodiment of the present invention. The third embodiment is established by combining the first and second embodiments. Accordingly, the further description of the third embodiment is deemed redundant and thus omitted merely for the sake of simplifying the disclosure.

Figure 10:
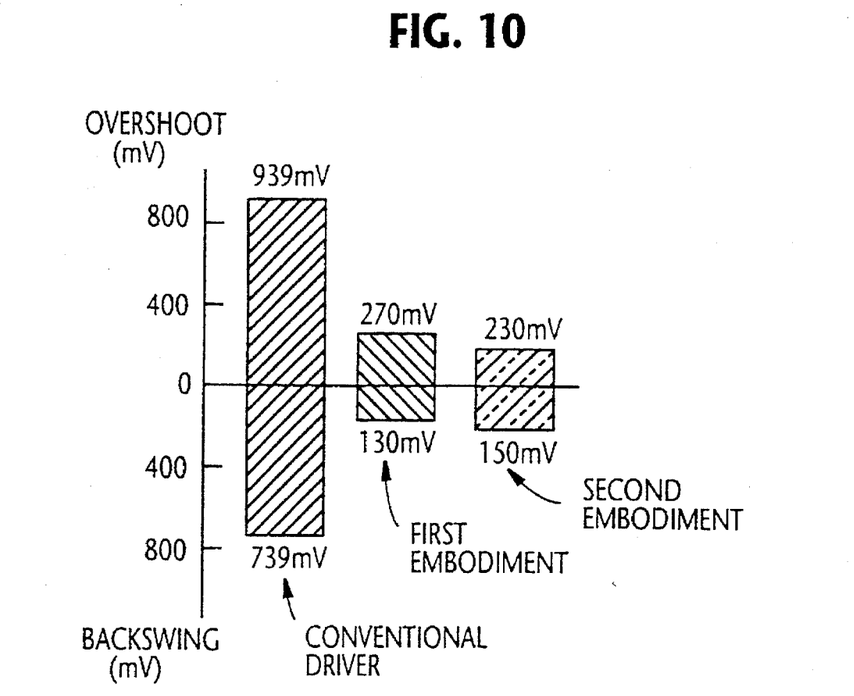
FIG. 10 is a diagram schematically comparing "overshoot" values of the conventional driver of FIG. 2 and the first and second embodiments.

FIG. 10 shows the overshoots in connection with the conventional driver 30 and the first and second embodiments.

Figure 11:
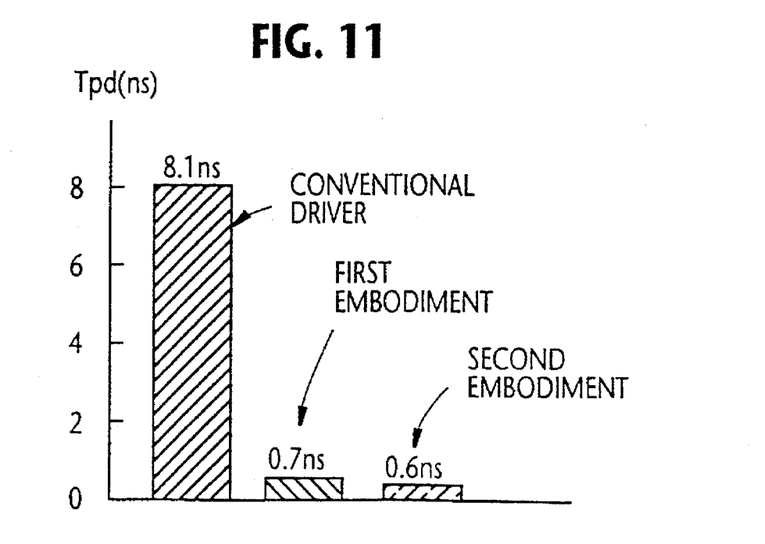
FIG. 11 is a diagram schematically comparing "propagation delay Tpd" values of the conventional driver of FIG. 2 and the first and second embodiments.

FIG. 11 shows the propagation delays Tpd in connection with the conventional driver 30 and the first and second embodiments.

It will be understood that the above disclosure is representative of three possible embodiments of the present invention and that the concept on which the invention is based is not specifically limited thereto.

What is claimed is:

1. A driver for interfacing a plurality of integrated circuits to a bus, said driver comprising:

an inverter (62, 64) provided between first and second power sources (66, 68);

an output transistor (43) whose gate is coupled to an output of said inverter and whose source-drain path is coupled between an output (38a) of said driver and said second power source;

a feedback path coupled between the output of said driver and the output of said inverter, said feedback path including first and second transistors (56, 54) coupled in series, said first transistor (56) having a gate thereof coupled to an input of said inverter, said second transistor (54) having a gate thereof coupled to the output of said inverter via delay means;

characterized in that an impedance controller (72, 74) is provided between the output of said inverter and said second power source, said impedance controller stepwisely adjusting impedance of said output transistor when an input signal to said inverter changes from a low logic level to a high logic level.

2. A driver as claimed in claim 1, wherein said impedance controller includes a plurality of transistors (72, 74) coupled in parallel with each other, said plurality of transistors being non-conductive while said input signal assumes the low logic level and being successively rendered conductive in response to a change of said input signal from the low logic level to the high logic level.

3. A driver as claimed in claim 2, wherein said delay means including a plurality of inverters (70a–70f) coupled in series, said plurality of transistors of said impedance controller having gates thereof coupled to said inverters such as to be successively rendered conductive.

4. A driver as claimed in claim 1, further comprising another impedance controller (82a, 82b) which is provided in parallel with said second transistor, said another impedance controller stepwisely adjusting impedance of said output transistor when an input signal to said inverter changes from a low logic level to a high logic level.

5. A driver as claimed in claim 4, wherein said another impedance controller includes a plurality of transistors (82a, 82b) coupled in parallel with each other, said plurality of transistors being non-conductive while said input signal assumes the low logic level and being successively rendered conductive in response to a change of said input signal from the low logic level to the high logic level.

6. A driver as claimed in claim 5, wherein said delay means including a plurality of inverters (70a–70f) coupled in series, said plurality of transistors of said another impedance controller having gates thereof coupled to said inverters such as to be successively rendered conductive.

7. A driver as claimed in claim 5, wherein said impedance controller includes a plurality of transistors (82a, 82b) coupled in parallel with each other, said plurality of transistors being non-conductive while said input signal assumes the low logic level and being successively rendered conductive in response to a change of said input signal from the low logic level to the high logic level.

8. A driver as claimed in claim 7, wherein said delay means including a plurality of inverters (70a–70f) coupled in series, said plurality of transistors of said impedance controller having gates thereof coupled to said inverters such as to be successively rendered conductive.

9. A driver for interfacing a plurality of integrated circuits to a bus, said driver comprising:

an inverter (62, 64) provided between first and second power sources (66, 68);

an output transistor (43) whose gate is coupled to an output of said inverter and whose source-drain path is coupled between an output (38a) of said driver and said second power source;

a feedback path coupled between the output of said driver and the output of said inverter, said feedback path including first and second transistors (56, 54) coupled in series, said first transistor (56) having a gate thereof coupled to an input of said inverter, said second transistor (54) having a gate thereof coupled to the output of said inverter via delay means;

characterized in that an impedance controller (82a, 82b) is provided in parallel with said second transistor, said impedance controller adjusting stepwisely impedance of said output transistor when an input signal to said inverter changes from a low logic level to a high logic level.

* * * * *